United States Patent
Schäffer

(10) Patent No.: US 7,253,475 B2
(45) Date of Patent: Aug. 7, 2007

(54) POWER TRANSISTOR CELL AND POWER TRANSISTOR COMPONENT WITH FUSIBLE LINK

(75) Inventor: Carsten Schäffer, Sattendorf (AT)

(73) Assignee: Infineon Technologies AG, Munich (DE)

( * ) Notice: Subject to any disclaimer, the term of this patent is extended or adjusted under 35 U.S.C. 154(b) by 311 days.

(21) Appl. No.: 11/009,537

(22) Filed: Dec. 10, 2004

(65) Prior Publication Data

US 2005/0157571 A1 Jul. 21, 2005

(30) Foreign Application Priority Data

Dec. 12, 2003 (DE) ............... 103 58 324

(51) Int. Cl.
*H01L 29/76* (2006.01)
(52) U.S. Cl. ............ 257/341; 257/330; 257/529
(58) Field of Classification Search ........ 257/341, 257/379, 330, 331, 529
See application file for complete search history.

(56) References Cited

U.S. PATENT DOCUMENTS

| 5,021,861 | A |   | 6/1991 | Baliga |
| 5,392,187 | A | * | 2/1995 | Baliga ............... 257/529 |
| 5,446,310 | A |   | 8/1995 | Baliga et al. |
| 6,080,649 | A |   | 6/2000 | Werner et al. |
| 6,303,980 | B1 |  | 10/2001 | Werner et al. |
| 6,524,941 | B2 |  | 2/2003 | Hsu et al. |
| 6,756,655 | B2 |  | 6/2004 | Le et al. |
| 2002/0084508 | A1 |  | 7/2002 | Le et al. |

FOREIGN PATENT DOCUMENTS

| DE | 196 00 398 C1 | 3/1997 |
| DE | 199 26 107 C1 | 11/2000 |
| EP | 0 852 396 A2 | 7/1998 |
| JP | 2001 177093 A | 6/2001 |

* cited by examiner

*Primary Examiner*—Mark V. Prenty
(74) *Attorney, Agent, or Firm*—Maginot, Moore & Beck

(57) ABSTRACT

Transistor cells (2) of a power transistor component are in each case provided with a gate conductor structure that forms a gate electrode (52) in sections and is connected via a gate cell terminal (43) to a gate wiring line (81) led to a gate terminal (44) of the power transistor component (1). The gate conductor structure (5) has a desired fusible section (51) with an increased resistance, which is arranged within a cavity. The resistance of the desired fusible section (51) can be set in such a way that, in the event of a current loading of the magnitude of a value that is typical of a defective gate dielectric (41), the gate conductor section (5) is interrupted in the desired fusible section (51) and the gate electrode (52) is disconnected from the gate wiring line (81). The power transistor component can be produced with high yield and has a smaller number of failures during application operation.

16 Claims, 5 Drawing Sheets

POWER TRANSISTOR CELL AND POWER TRANSISTOR COMPONENT WITH FUSIBLE LINK

BACKGROUND

The invention relates to a power transistor cell with a gate cell terminal and a gate conductor structure—connected to the gate cell terminal—with an electrode section—adjoining a gate dielectric—for controlling the power transistor cell, and also to a power transistor component with fusible link.

Power semiconductor components are constructed from a multiplicity of essentially identical transistor cells that are often connected in parallel in their tens of thousands in order to increase the current-carrying capacity of the power semiconductor component. In modern vertically patterned power semiconductor components, the gate electrode of a respective transistor cell is in this case provided in a trench introduced into a semiconductor substrate, so that the gate electrode can be used to control a vertical conductive channel between two source and drain terminal regions opposite one another at the semiconductor substrate. The gate electrodes of the transistor cells of a power semiconductor component, for instance of a vertical MOSFET (metal oxide semiconductor field effect transistor) or of an IGBT (insulated gate bipolar transistor), are connected in parallel.

The functionality of the power semiconductor component is generally ensured only when the gate dielectric of all the transistor cells of a power semiconductor component is functionally capable. A short circuit between the gate electrode and the source or drain region of a transistor cell leads to the failure of the entire power semiconductor component. Since a plurality of power semiconductor components are connected in parallel as so-called power modules within a module housing, the requirements made of the reliability of the design of the gate dielectric multiply.

A single defect in the gate dielectric may lead to the failure of the component either at the end of production or after a relatively long operating time of the power semiconductor component.

In order to keep down the more critical failures during application operation of the power semiconductor components, the power semiconductor components are subjected to a stress test in the course of which the quality or defectiveness of the component is tested. For this purpose, generally at the wafer level, a stress voltage that is significantly increased compared with the operating voltages is applied between the gate electrode and the source or drain terminal in order to cause transistor cells with a defective gate dielectric to fail as early as in the test bed. The magnitude of the stress voltage is limited by the intrinsic breakdown voltage of the gate dielectric since, above the intrinsic breakdown voltage, charges are impressed into the gate dielectric and in turn reduce the service life of the gate dielectric.

Furthermore, it is known that power semiconductor components from wafers or from batches of wafers for which a broad distribution band of the breakdown voltage is determined tend toward early failures during application operation with a higher probability than power semiconductor components from wafers or from batches with a narrow distribution band of the breakdown voltage. In order to preclude as far as possible early failures during application operation, such wafers or else batches of such wafers are completely rejected. The production yield is thereby significantly reduced.

Moreover, complicated examinations in respect of the actual formation of the gate dielectric in the form of spot checks within a monitoring are necessary since the density of defects (defect density) in the gate dielectric cannot necessarily be deduced from the result of the stress test.

Therefore, various approaches are known for increasing the yield of power semiconductor components produced without any defects by subsequently disconnecting defective memory cells.

For instance, it is known to group transistor cells of MOS power field effect transistors into cell blocks and to test the cells or else cell blocks individually. In a subsequent process, only those cell blocks which have proved to be free of defects in the test are connected to the source terminal or to the drain terminal of the power semiconductor component.

U.S. Pat. No. 5,021,861 discloses a cell concept for power semiconductor components in which a fusible link is provided between the gate terminal of the power semiconductor component and the gate terminal of each cell block. In this case, the fusible link is designed in such a way that a short circuit in the cell block leads to the fusing of the fusible link. Any cell block that has one or a plurality of defective cells is isolated by interrupting the connection between the gate terminal of the cell block and the gate terminal of the power semiconductor component.

What is disadvantageous about this concept is the lack of sensitivity of the fusible link since, on the one hand, even very small gate leakage currents indicate a defective transistor cell, and, on the other hand, the fusible link must be robust enough to take up the permissible gate current of all the cells that are connected in parallel in the cell block.

U.S. Pat. No. 5,446,310 therefore proposes, in a first step, determining the current consumption at the gate electrode of individual cell blocks and, in a second step, by means of an external current source, fusing corresponding fusible links assigned to the cell blocks in a manner dependent on the previous test result.

In this case, firstly the increased outlay in the test bed is disadvantageous, as is the fact that the fusible links can only be fused in the test bed, but not in the finished, housed component. Furthermore, through the uncoupling of entire cell blocks, the current-carrying capacity of the power semiconductor component is significantly reduced and the loading on the remaining cell blocks is increased. Through the assignment of a respective fusible link to a plurality of transistor cells grouped in a cell block, generally not only the defective transistor cell itself but also a series of inherently functionally capable transistor cells are uncoupled and the current-carrying capacity of the power semiconductor component is reduced to a greater extent than is necessary.

Therefore, the invention is based on the object of providing a transistor cell and a power transistor component with high reliability for which a high yield is ensured in production.

SUMMARY

A power transistor cell has a gate cell terminal. A plurality of power transistor cells of a power transistor component are connected to a gate wiring line via the gate cell terminal. The gate wiring line is led to a gate terminal of the power transistor device. The power transistor cell additionally has a gate conductor structure, which is connected to the gate cell terminal and has an electrode section adjoining a gate dielectric.

According to the invention, the gate conductor structure has at least one desired fusible section arranged within a cavity. The desired fusible section is fused by thermal heating when a maximum permissible current flow through the desired fusible section of the gate conductor structure is exceeded. The connection of the electrode section of the gate conductor structure to the gate cell terminal is interrupted after the fusing of the desired fusible section.

In the case of customary fusible links that are embodied completely within an insulator layer surrounding the fusible link, only approximately 1 to 10% of the triggering energy is required for fusing the desired fusible section itself, while the predominant part by far of the triggering energy is dissipated as heat into the surrounding insulator layer. Arranging a desired fusible section within a cavity reduces the triggering energy by a factor of 10 to 100. Such a fusible link for programmable memory cells is disclosed for instance in DE 196 00 398 C1. The comparatively low triggering energy of a cavity fusible link enables the fusible link to be triggered by an individual defective transistor cell.

Consequently, it is possible to fabricate power transistor components whose transistor cells are in each case assigned a dedicated fusible link. Compared with known arrangements, an increased production yield advantageously results by virtue of the fact that fewer devices have to be rejected on suspicion. The fusible link of the transistor cell according to the invention can also be activated during application operation of the power semiconductor component, thereby significantly improving the reliability in the field.

In addition to a gate electrode formed as a section of the gate conductor structure, the power transistor cell comprises an active region with a source region, a drain region extended by a drift region, and also a body region arranged between the source region and the drain region. The formation of a conductive channel between the source region and the drain region can be controlled by a potential at the gate electrode. The active region is formed in a semiconductor substrate.

In a preferred embodiment, the power transistor cell according to the invention has a gate conductor structure whose desired fusible section is arranged on or above the substrate surface of the semiconductor substrate and extends in planar fashion in a plane that is horizontal with respect to the substrate surface. In this case, the desired fusible section is provided above or beside the active region of the power transistor cell. The horizontal dimensions such as length and width of the desired fusible section may be set by means of a lithographic method or by customary sublithographic etching patterning methods.

The power transistor cell is preferably formed as a vertical power transistor cell, the gate electrode being provided as a section of the gate conductor structure in a gate trench introduced into a semiconductor substrate. The conductive channel between the source region and the drain region is essentially formed in a direction perpendicular to the substrate surface.

In the case of a power transistor cell with a gate electrode formed in the gate trench, the desired fusible section of the gate conductor structure is provided by a section of the gate conductor structure that is arranged as a conformal layer of uniform layer thickness at least in sections on sidewalls of the gate trench.

In this case, the layer thickness of the conformal layer is dimensioned in such a way that portion of the gate trench which is not filled by the conformal layer forms the cavity assigned to the desired fusible section. It is then advantageous that the cavity itself does not require an additional etching step. Furthermore, the cavities are advantageously formed in a self-aligned manner with respect to the desired fusible sections.

Outside the desired fusible section, a gate conductor structure having the lowest possible impedance is necessary for safeguarding the functionality of the power transistor cell in order, by way of example, to ensure sufficiently fast switch-on and switch-off times.

According to a preferred embodiment of the power transistor cell according to the invention with a desired fusible section provided as a conformal layer within the gate trench, the opening region of the gate trench is covered by an auxiliary structure. The auxiliary structure has an admission opening to the gate trench, the cross section of which is smaller than the opening region of the gate trench. Through the cross section of the admission opening, in the event of a conformal deposition of the gate conductor structure, the layer thickness of the gate conductor structure or of the gate electrode in the interior of the gate trench is determined by half the width of the admission opening.

The desired fusible section may also comprise parts of the gate electrode or be partly or completely identical to the electrode section of the gate conductor structure.

The auxiliary structure is formed from a dielectric material, for instance an oxide such as silicon oxide, for instance. The alignment of the admission opening with respect to the trench opening is comparatively noncritical. Above the admission opening, the gate conductor structure can be provided with the required layer thickness in a manner decoupled from the layer thickness of the desired fusible section in the course of the same deposition process.

According to an alternative exemplary embodiment of the power transistor cell according to the invention, the gate trench is provided with a cross section that decreases toward the trench opening. The cross section of the opening region of the gate trench determines the layer thickness of the gate conductor structure in a lower section of the gate trench adjoining the opening region of the gate trench.

According to a further preferred embodiment of the power transistor cell according to the invention, the opening region of the gate trench is covered by an auxiliary chamber structure having an admission opening. The admission opening is provided in sections with a small cross section that prescribes the layer thickness of the desired fusible section. The gate conductor structure is led from a section of the gate conductor structure provided above the auxiliary chamber structure through the admission opening to the gate electrode in the gate trench arranged below the auxiliary chamber structure.

The admission opening furthermore has sections with an extended cross section that form the cavity assigned to the desired fusible section.

Preferably, in this case the cavity is formed in a central section of the admission opening.

The power transistor component according to the invention has a gate terminal and a plurality of parallel-connected transistor cells. The gate electrodes of the transistor cells are connected in each case to the gate terminal of the power transistor component via a gate wiring line.

According to the invention, at least one subset of the transistor cells is in each case provided with a gate conductor structure with a desired fusible section that is arranged within a cavity.

Preferably, all the transistor cells of the power transistor component are formed in accordance with one of the transistor cells described above.

A further power transistor component according to the invention has a gate terminal and a gate wiring line connected to the gate terminal. A plurality of cell blocks with parallel-connected transistor cells with a respective gate conductor structure with an electrode section has in each case a gate cell block terminal connected to the gate conductor structures of the transistor cells of the cell block. Fusible link devices are provided between in each case one of the gate cell block terminals and the gate wiring line.

According to the invention, the fusible link devices are in each case arranged in a cavity of an insulator structure.

BRIEF DESCRIPTION OF THE DRAWINGS

The invention and its advantages are explained in more detail below with reference to figures, mutually corresponding components being designated by the same reference symbols. In the figures.

DESCRIPTION

Figure 1:
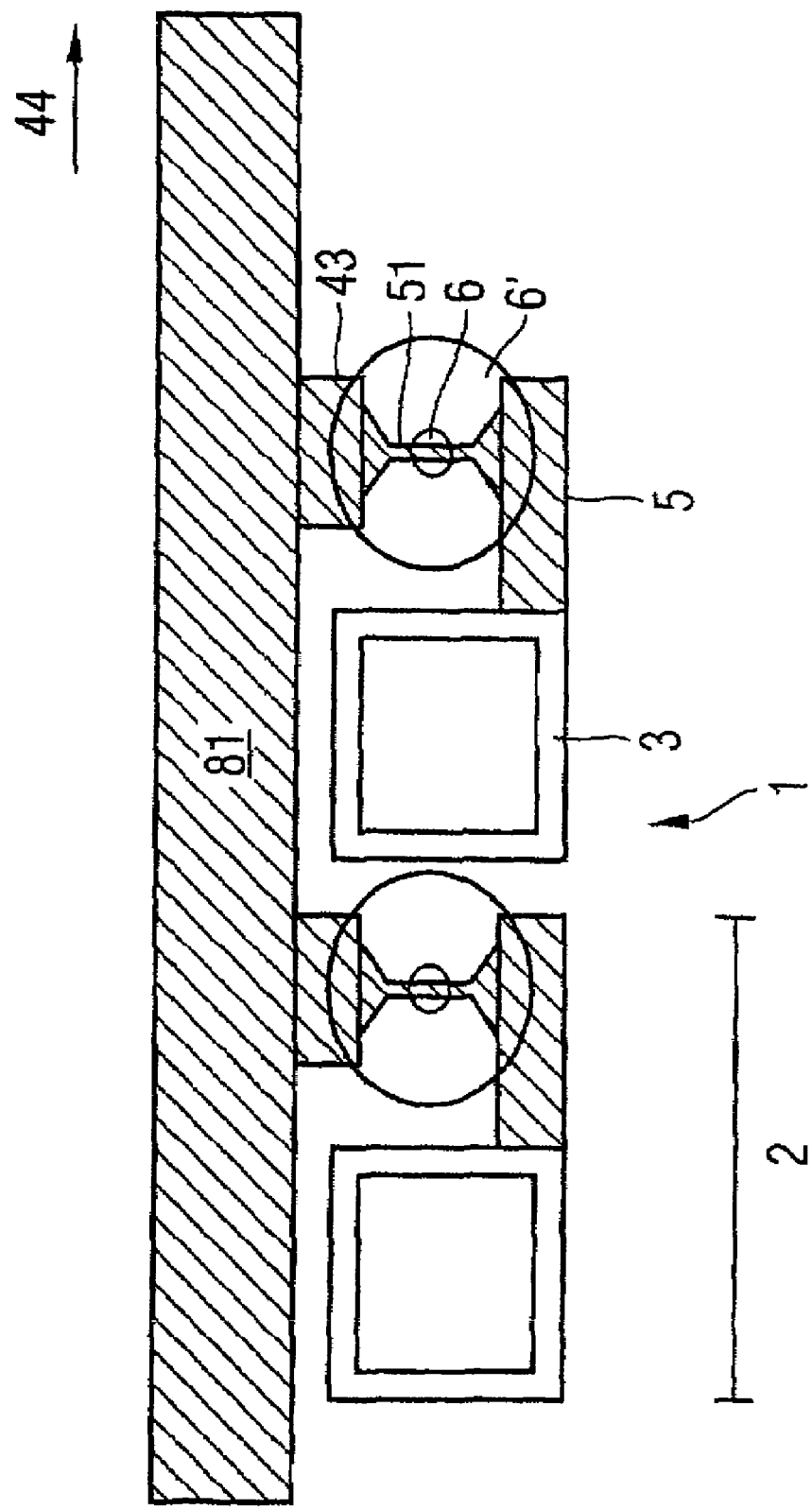
FIG. 1 shows a schematic plan view of two transistor cells of a power transistor component according to a first exemplary embodiment of the invention with a gate conductor section with a desired fusible section formed in planar fashion.

The power transistor component 1 illustrated in FIG. 1 has a plurality of power transistor cells 2 that are essentially identical to one another. Each power transistor cell is defined by an active region 3 which is formed in a semiconductor substrate and comprises at least a source region, a drain region and a body region. A gate conductor structure 5 is led to the active region 3 and forms a gate electrode in sections in the region of the active region 3. Each transistor cell 2 is assigned a gate cell terminal 43. A gate wiring line 81 connects the gate cell terminals 43 to a gate terminal 44 of the power transistor component 1. The gate conductor structure 5 has a cross-sectional constriction in a desired fusible section 51. The desired fusible section 51 is formed on the semiconductor substrate in a cavity 6 of an insulator layer covering the gate conductor structure 5.

If a transistor cell 2 has a defective gate dielectric, then a defect current flows in the region of the defective transistor cell 2 between the gate terminal 44 and a source or drain terminal of the power transistor component 1. In the region of the desired fusible section 51, a defect current that is characteristic of a defective gate dielectric leads to the fusing of the gate conductor structure 5 in the desired fusible section 51. Consequently, the gate electrode of the transistor cell 2 is isolated from the gate wiring line 81. The isolated transistor cell 2 is inactive and can no longer contribute to the failure of the power transistor component 1.

Figure 2:
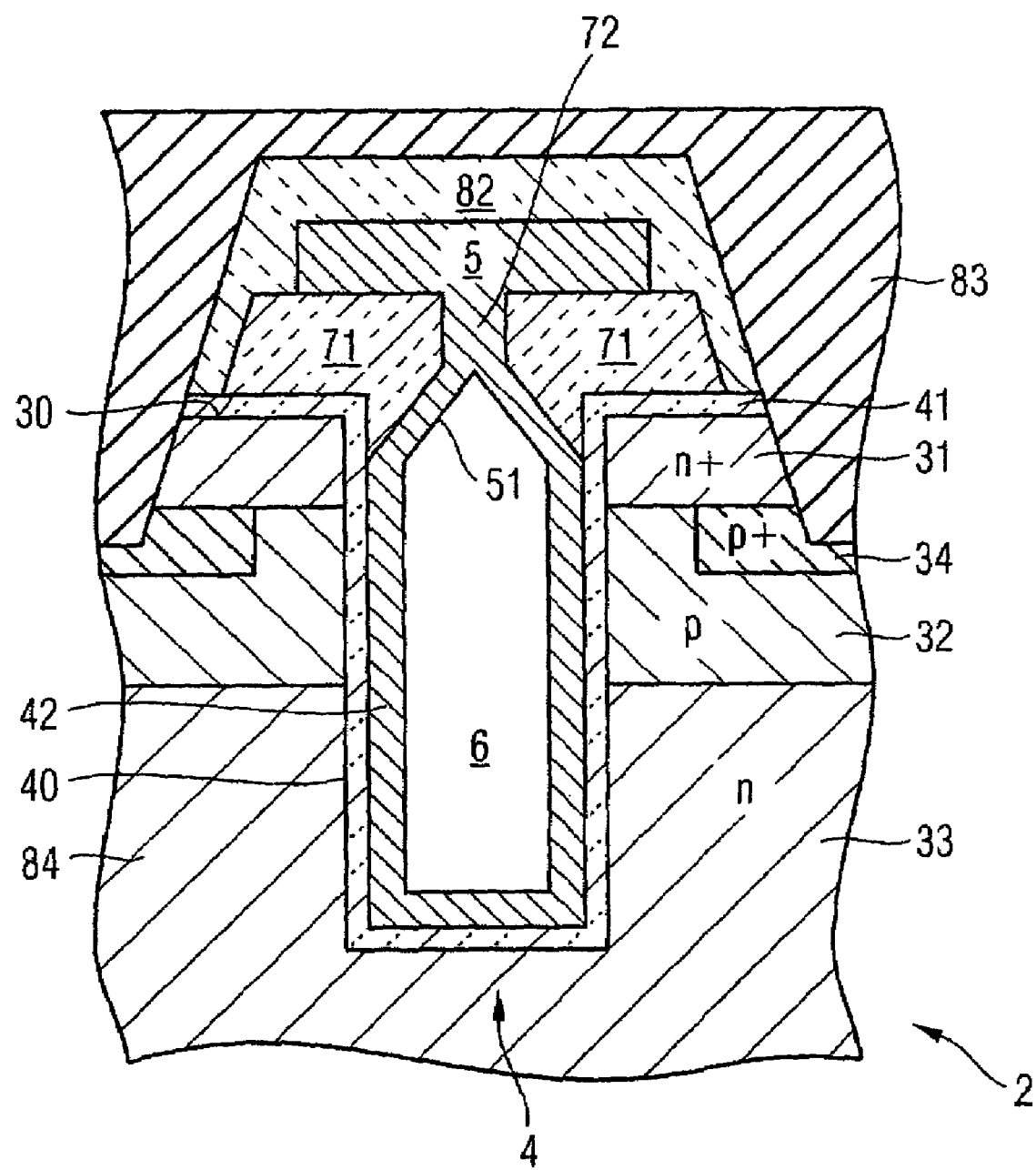
FIG. 2 shows a schematic cross section through a power transistor cell according to a second exemplary embodiment with an admission opening to the gate trench that is provided in an auxiliary structure.

FIG. 2 shows a power transistor cell with a gate trench. The gate trench 4 is introduced into a semiconductor substrate 84 from a substrate surface 30. In the semiconductor substrate 84, there are formed, in each case as doped regions, a source region 31 adjoining the substrate surface 30, a body region 32 below the source region 31 and, adjoining the body region 32, a drift region 33 of a drain region. A gate dielectric 41 insulates a gate electrode 52—formed within the gate trench 4 as an electrode section of a gate conductor structure 5—from the semiconductor substrate 84 enclosing the gate trench 4 essentially in the region of the body region 32.

The gate electrode or the electrode section 52 of the gate conductor structure 5 is provided as a layer of uniform thickness as a lining of the gate trench 4. In the region of the opening of the gate trench 4, an auxiliary structure 71 made of an electrically insulating material, for instance silicon oxide, bears on the substrate surface 30. The auxiliary structure 71 has an admission opening 72 above the gate trench 4, through which opening the gate conductor structure 5 is led from the gate trench 4 to the upper edge of the auxiliary structure 71. Above the auxiliary structure 71, the gate conductor structure 5 forms a gate cell terminal 43 or, directly above the admission opening 72, adjoins an overlying gate wiring line. An interlayer dielectric 82 insulates sections of a gate wiring line that are formed by the sections of the gate conductor structure 5 that are arranged above the auxiliary structure 71 from an overlying metallization 83. The metallization 83 connects the source regions 31 to a source terminal of the power transistor component via a terminal region 34 with increased doping.

The gate conductor structure 5 of transistor cells whose gate trenches are formed in the manner of hole trenches has the smallest cross section in the upper region of the gate trench 4. A desired fusible section 51 of the gate conductor structure 5 is defined by the region of the smallest cross section. That portion of the gate trench 4 which is not filled by the material of the gate conductor structure 5 forms a cavity 6. In the case of a short-circuit current between the gate conductor structure 5 and the source region 31 or the body region 32 or the drift region 33, the gate conductor structure 5 is heated the most rapidly in the desired fusible section 51 owing to the comparatively high resistance. Since the desired fusible section 51 is arranged within the cavity 6, the heat generated is dissipated poorly. Given a suitable choice of the layer thickness of the gate conductor structure 5 within the gate trench 4 and also of the resistivity of the gate conductor structure 5, which can be set by doping, the gate conductor structure 5 fuses in the desired fusible section 51, thereby interrupting the short-circuit path. The transistor cell is deactivated.

Figure 3:
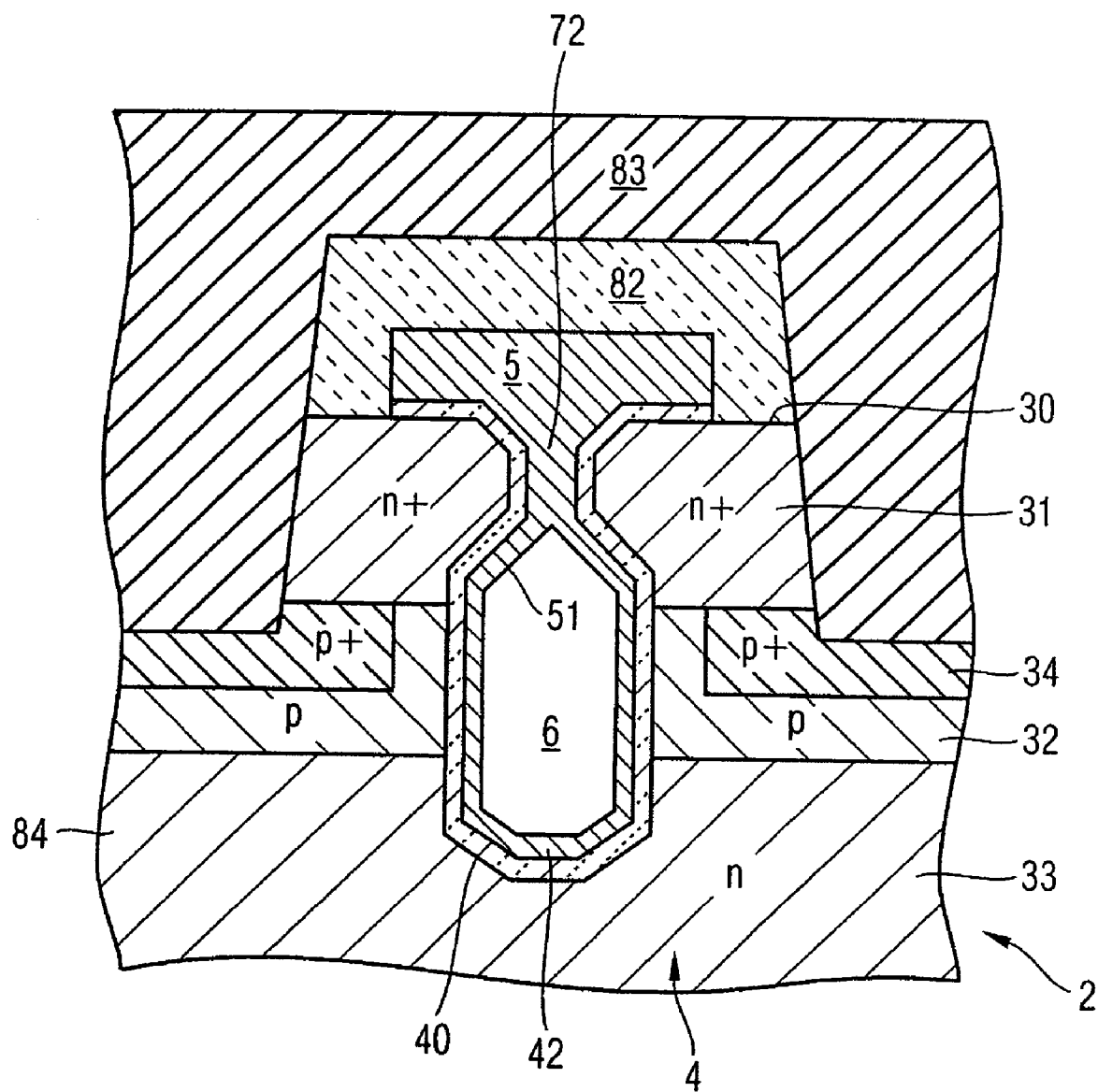
FIG. 3 shows a schematic cross section through a power transistor cell according to a third exemplary embodiment with a gate trench with a reduced opening cross section.

In contrast to the gate trench of the transistor cell illustrated in FIG. 2, the gate trench 4 of the transistor cell 2 illustrated in cross section in FIG. 3 has a cross section that tapers in the direction of the substrate surface 30. Such a formation of the gate trench 4 can be obtained for instance by means of an annealing process in a hydrogen atmosphere. The need to provide an auxiliary structure 71 is accordingly obviated. The admission opening 72 is self-aligned with respect to the gate trench 4 without an additional lithographic process.

The layer thickness of the gate conductor structure 5 within the gate trench 4 and thus the layer thickness of the desired fusible section 51 of the gate conductor structure 5 can be set by way of the width of the admission opening 72.

Figure 4:
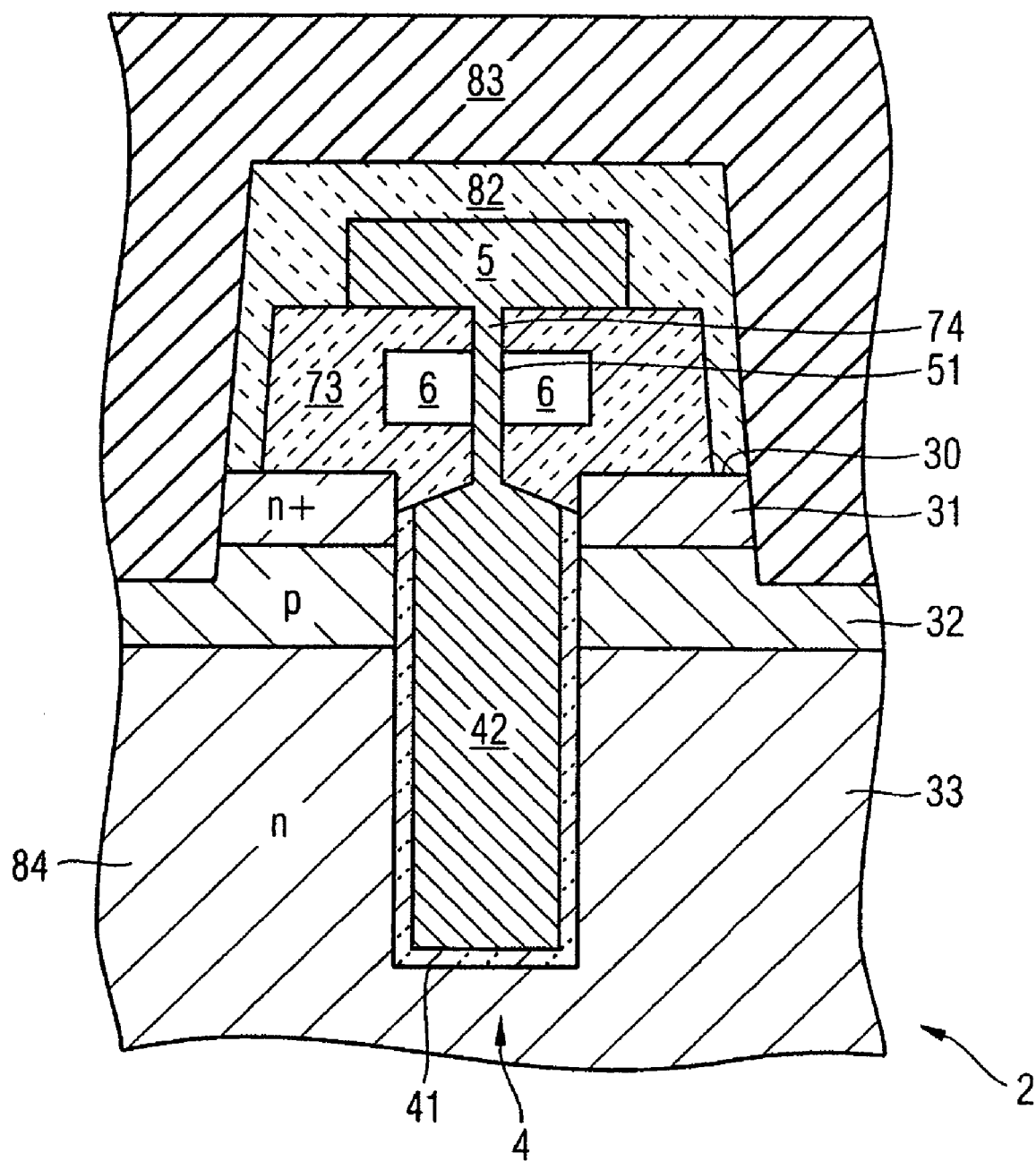
FIG. 4 shows a schematic cross section through a power transistor cell according to a fourth exemplary embodiment with an auxiliary chamber structure provided above the gate trench.

In the exemplary embodiment illustrated in FIG. 4, the gate trench 4 of the transistor cell 2 is completely filled with a gate electrode formed as an electrode section 52 of a gate conductor structure 5. The desired fusible section 51 is formed in the region of an auxiliary chamber structure 73 bearing on the substrate surface 30 in the region of the gate trench 4. The auxiliary chamber structure 73 has an admission opening 74, which connects a gate wiring line bearing on the auxiliary chamber structure 73 or a section of the gate conductor structure 5 bearing on the auxiliary chamber structure 73 to the gate electrode 52 arranged in the interior of the gate trench 4. The admission opening 74 has in sections a small cross section by means of which it is possible to set the layer thickness or the cross section of the desired fusible section 51 of the gate conductor structure 5. Furthermore, the admission opening 74 of the auxiliary chamber structure 73 has a central section in which the cross section of the admission opening is larger than the cross section of the section of the gate conductor structure 5 that is led through the admission opening 74. The section of the admission opening 74 with the extended cross section forms the cavity 6 assigned to the desired fusible section 51.

Figure 5:
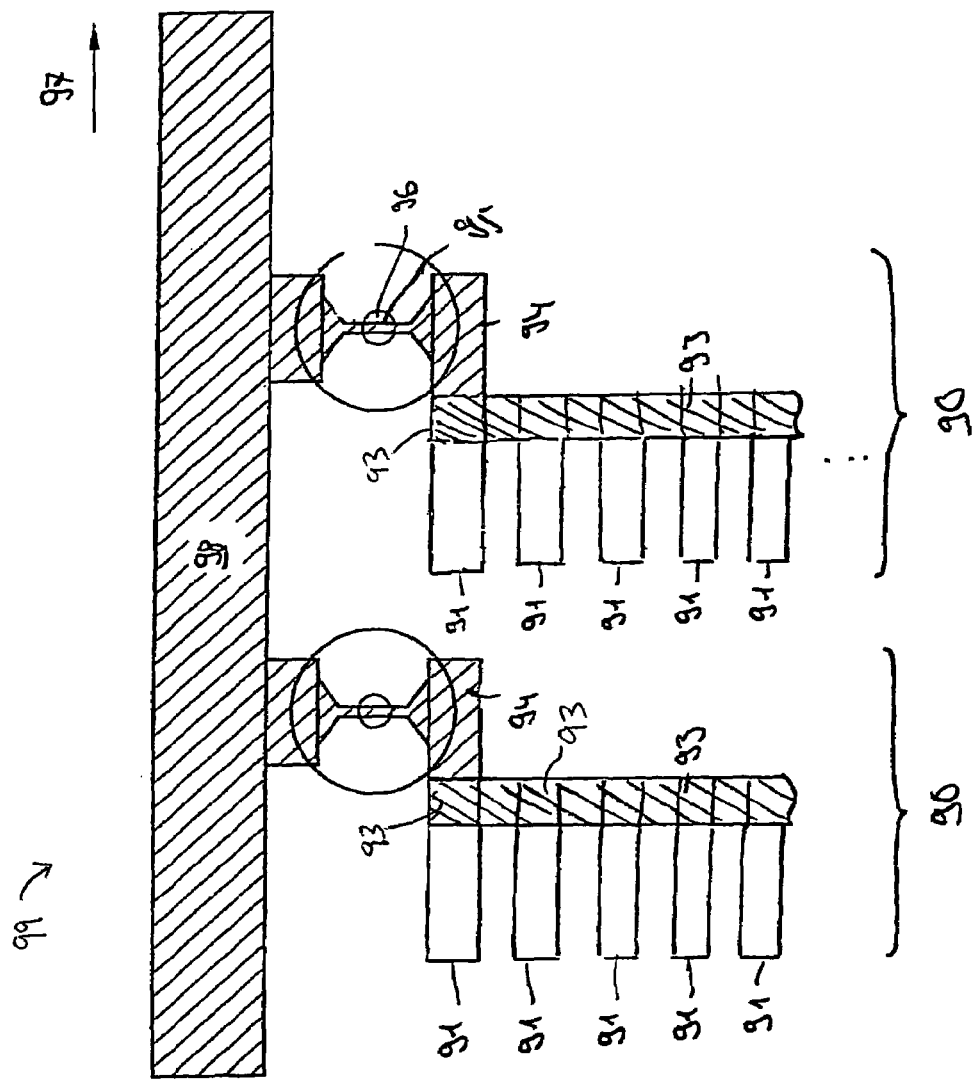
FIG. 5 shows a schematic plan view of two cell blocks of a power transistor component according to a fifth exemplary embodiment of this invention.

FIG. 5 shows another embodiment of the invention. The embodiment of FIG. 5 is similar to that of FIG. 1, except that each of the transistor cells 2 of FIG. 1 has been replaced in the embodiment of FIG. 5 by a cell block 90 of parallel-connected cells 91. In particular, FIG. 5 shows a power transistor component 99 according to the invention that includes a gate terminal 97 and a gate wiring line 98 connected to the gate terminal 97. These elements are similar the corresponding elements of the embodiment of FIG. 1. The component 99 further includes two cell blocks 90, each having parallel-connected transistor cells 91 and a gate conductive structure 93 with an electrode section. Because the cells 91 are parallel connected, the gate conductive structures 93 of the cells 91 of each cell block 90 are conductively coupled. At least one gate conductive structure 93 is further coupled to a gate cell block terminal 94. Fusible link devices 96 are provided between each gate cell block terminal 94 and the gate wiring line 98. A cavity 95 is provided that adjoins the fusible link devices 96, similar to the corresponding cavities 6 of FIG. 1.

LIST OF REFERENCE SYMBOLS

1 Power transistor component
2 Transistor cell
3 Active region
30 Substrate surface
31 Source region
32 Body region
33 Drift region
34 Terminal region
4 Gate trench
40 Sidewalls
41 Gate dielectric
44 Gate terminal
43 Gate cell terminal
5 Gate conductor structure
51 Desired fusible section
52 Electrode section
6 Cavity
6' Cavity
71 Auxiliary structure
72 Admission opening
73 Auxiliary chamber structure
74 Admission opening
81 Gate wiring line
82 Interlayer dielectric
83 Metallization
84 Semiconductor substrate

The invention claimed is:

1. A power transistor cell formed in a semiconductor substrate, the power transistor cell comprising:
a gate cell terminal;
a gate conductor structure connected to the gate cell terminal, the gate conductor structure including an electrode section and a fusible section, the electrode section formed in a gate trench of the semiconductor substrate and adjoining a gate dielectric, the fusible section formed between the electrode section and the gate cell terminal, wherein the fusible section is operable to interrupt a current flow through the fusible section in the event the current flow in the fusible section is characteristic of a defective gate dielectric; and
a cavity adjoining the fusible section.

2. The power transistor cell of claim 1 wherein the fusible section of the gate conductor structure is arranged in planar fashion on a substrate surface of the semiconductor substrate, and the cavity is formed in an insulator layer covering the gate conductor structure.

3. The power transistor cell of claim 1 wherein the fusible section is formed by a section of the gate conductor structure that is arranged as a conformal layer having uniform layer thickness at least in sections on sidewalls of the gate trench, and wherein the cavity is formed by an unfilled inner section of the gate trench.

4. The power transistor cell of claim 3 wherein the gate trench comprises an opening region and a lower section adjoining the opening region, wherein the opening region has a smaller cross section than the lower section, and wherein the gate conductor structure has a layer thickness within the gate trench determined by the cross section of the opening region.

5. The power transistor cell of claim 1 wherein the gate trench comprises an opening region and the opening region of the gate trench is covered by an auxiliary structure that defines an admission opening, wherein the admission opening has a smaller cross section than the gate trench, wherein the gate conductor structure passes through the admission opening, and wherein gate conductor structure has a layer thickness within the gate trench determined by the cross section of the admission opening.

6. The power transistor cell of claim 1 wherein the gate trench comprises an opening region and the opening region is covered by an auxiliary chamber structure having an admission opening, wherein the admission opening is provided in a plurality of sections with at least one of the plurality of sections having a small cross section, wherein the fusible section has a layer thickness determined by the small cross section of the admission opening, wherein the gate conductor structure passes through the admission opening, and wherein the cavity is provided by one of the plurality of sections of the admission opening having an extended cross section.

7. The power transistor cell of claim 6 wherein the cavity is formed in a central section of the plurality of sections of the admission opening.

8. A power transistor component comprising:
a gate terminal;
a plurality of parallel-connected transistor cells, each of the plurality of transistor cells comprising a gate conductor structure including an electrode section, wherein the gate conductor structure is connected to the gate terminal via a gate wiring line; and a plurality of fusible links, each of the plurality of fusible links provided between one of the electrode sections and the gate terminal;

wherein each of the plurality of fusible links is provided as a fusible section on one of the gate conductor structures, the fusible section formed between the electrode section and the gate cell terminal with a cavity adjoining the fusible section, wherein the fusible section is operable to interrupt a current flow through the fusible section in the event the current flow in the fusible section is characteristic of a defective gate dielectric.

9. The power transistor component of claim 8 wherein the fusible section of each of the gate conductor structures is arranged in planar fashion, and each cavity is formed in an insulator layer covering each of the gate conductor structures.

10. The power transistor component of claim 8 wherein each of the plurality of transistor cells is formed in a semiconductor substrate, the electrode sections are formed in gate trenches of the semiconductor substrate, and the cavities are formed by unfilled inner sections of the gate trenches.

11. The power transistor component of claim 10 wherein each of the gate trenches comprise an opening region and a lower section adjoining the opening region, wherein the opening region has a smaller cross section than the lower section, and wherein the gate conductor structure has a layer thickness within the gate trench determined by the cross section of the opening region.

12. The power transistor component of claim 8 wherein each of the plurality of transistor cells is formed in a semiconductor substrate, the electrode sections are formed in gate trenches of the semiconductor substrate, and each of the gate trenches comprise an opening region covered by an auxiliary structure that defines an admission opening, wherein the admission opening has a smaller cross section than the gate trench, wherein the gate conductor structure passes through the admission opening, and wherein gate conductor structure has a layer thickness within the gate trench determined by the cross section of the admission opening.

13. The power transistor component of claim 8 wherein each of the plurality of transistor cells is formed in a semiconductor substrate, the electrode sections are formed in gate trenches of the semiconductor substrate, and each of the gate trenches comprise an opening region covered by an auxiliary chamber structure having an admission opening, wherein the admission opening is provided in a plurality of sections with at least one of the plurality of sections having a small cross section, wherein the fusible section has a layer thickness determined by the small cross section of the admission opening, wherein the gate conductor structure passes through the admission opening, and wherein the cavity is provided by one of the plurality of sections of the admission opening having an extended cross section.

14. The power transistor component of claim 13 wherein the cavity is formed in a central section of the plurality of sections of the admission opening.

15. A power transistor component comprising:

a gate terminal;

a gate wiring line connected to the gate terminal;

a plurality of cell blocks comprising a plurality of parallel-connected transistor cells, each of the plurality of transistor cells comprising a gate conductor structure including an electrode section;

a plurality of gate cell block terminals, each of the plurality of gate cell block terminals connected to the gate conductor structure of one of the plurality of transistor cells;

a plurality of fusible link devices, each of the plurality of fusible link devices provided between one of the plurality of gate cell block terminals and the gate wiring line; and a plurality of cavities, each of the plurality of cavities adjoining one of the plurality of fusible link devices.

16. The power transistor component of claim 15 wherein the plurality of fusible link devices are each operable to interrupt current flow through the fusible link device in the event the current flow in the fusible link device is characteristic of a defective gate dielectric.

* * * * *